ized Patent

(12) United States Patent
Crouse, II et al.

(10) Patent No.: US 7,945,433 B2
(45) Date of Patent: May 17, 2011

(54) HARDWARE SIMULATION ACCELERATOR DESIGN AND METHOD THAT EXPLOITS A PARALLEL STRUCTURE OF USER MODELS TO SUPPORT A LARGER USER MODEL SIZE

(75) Inventors: Daniel R. Crouse, II, Hyde Park, NY (US); Gernot E. Guenther, Endicott, NY (US); Viktor Gyuris, Wappingers Falls, NY (US); Harrell Hoffman, Austin, TX (US); Kevin A. Pasnik, Cedar Park, TX (US); Thomas J. Tryt, Binghamton, NY (US); John H. Westermann, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 832 days.

(21) Appl. No.: 11/742,100

(22) Filed: Apr. 30, 2007

(65) Prior Publication Data
US 2008/0270748 A1 Oct. 30, 2008

(51) Int. Cl.
*G06F 9/445* (2006.01)
*G06F 9/30* (2006.01)

(52) U.S. Cl. ............... 703/14; 703/26; 717/140; 712/20

(58) Field of Classification Search ............... 703/2, 14, 703/16, 26; 716/4, 16; 717/140; 712/20; 709/239
See application file for complete search history.

(56) References Cited

U.S. PATENT DOCUMENTS

| | | | |
|---|---|---|---|
| 4,306,286 A | 12/1981 | Cocke et al. | |
| 4,847,755 A * | 7/1989 | Morrison et al. | 712/203 |
| 5,021,945 A * | 6/1991 | Morrison et al. | 712/216 |
| 5,386,531 A | 1/1995 | Blaner et al. | |
| 5,966,528 A * | 10/1999 | Wilkinson et al. | 712/222 |
| 6,094,715 A * | 7/2000 | Wilkinson et al. | 712/20 |
| 6,112,299 A * | 8/2000 | Ebcioglu et al. | 712/236 |
| 6,253,313 B1 * | 6/2001 | Morrison et al. | 712/226 |
| 6,799,264 B2 | 9/2004 | Goodhue et al. | |
| 2002/0010565 A1 | 1/2002 | Ho et al. | |
| 2002/0173943 A1 | 11/2002 | Armbruster et al. | |
| 2006/0005173 A1 * | 1/2006 | Eng | 717/140 |
| 2006/0117274 A1 * | 6/2006 | Tseng et al. | 716/1 |
| 2006/0277020 A1 * | 12/2006 | Ganesan et al. | 703/14 |
| 2008/0127006 A1 * | 5/2008 | Guenther et al. | 716/4 |

FOREIGN PATENT DOCUMENTS
JP 60173483 9/1985

* cited by examiner

*Primary Examiner* — Thai Phan
(74) *Attorney, Agent, or Firm* — Dennis Jung; Roberts Mlotkowski Safran & Cole, P.C.

(57) ABSTRACT

A system and method for design verification and, more particularly, a hardware simulation accelerator design and method that exploits a parallel structure of user models to support a large user model size. The method includes a computer including N number of logic evaluation units (LEUs) that share a common pool of instruction memory (IM). The computer infrastructure is operable to: partition a number of parallel operations in a netlist; and send a same instruction stream of the partitioned number of parallel operations to N number of LEUs from a single IM. The system is a hardware simulation accelerator having a computer infrastructure operable to provide a stream of instructions to multiple LEUs from a single IM. The multiple LEUs are clustered together with multiple IMs such that each LEU is configured to use instructions from any of the multiple IMs thereby allowing a same instruction stream to drive the multiple LEUs.

19 Claims, 3 Drawing Sheets

HARDWARE SIMULATION ACCELERATOR DESIGN AND METHOD THAT EXPLOITS A PARALLEL STRUCTURE OF USER MODELS TO SUPPORT A LARGER USER MODEL SIZE

FIELD OF THE INVENTION

The invention generally relates to a system and method for design verification and, more particularly, the invention relates to a hardware simulation accelerator design and method that exploits a parallel structure of user models to support a larger user model size.

BACKGROUND OF THE INVENTION

Hardware Simulation Accelerators have become a commonly used tool in the verification of complex logic designs. For example, hardware simulation accelerators are almost a necessity in design verification of very large logic designs, especially for system level verification. These hardware simulation accelerators not only provide a design tool but also are capable of providing diagnostics to detect design errors quickly.

Typically, the more advanced hardware simulation accelerators are capable of simulating logic designs having tens or hundreds of millions of components. To provide such capacity, the hardware simulation accelerators are parallel computers employing a field of ASIC chips. A flattened netlist of the design under test is mapped to the field of chips and the segment of the netlist that is mapped to a given simulator chip is stored in a compiled format in the instruction memory (IM). For modern accelerators, the IM is located on the chip, and often takes up half or more of the die's area (chip area). As should be understood, chips contain numerous LEUs that execute the compiled design in parallel while communicating with one another.

The "netlist" describes the connectivity of a logic design. Netlists usually convey connectivity information and provide instances, nets, and perhaps some attributes. Netlists can be either physical or logical; either instance-based or net-based; and flat or hierarchical. The latter can be either folded or unfolded. An "instance" is a part of the netlist, where each instance has a "master" or "definition". The definitions usually list the connections that can be made to a specific kind of device, and some basic properties of such device. An "instance" could be an integrated circuit chip, for example.

A "folded" hierarchy allows a single definition to be represented several times by instances. Folded hierarchies can be extremely compact. On the other hand, an "unfolded" hierarchy will not allow a definition to be used more than once in the hierarchy. Hierarchical designs can be "exploded" or "flattened" into flat designs via recursive algorithms. A "flat" design is one where only instances of primitives are allowed.

In the course of simulation, rows of the IM are read out in a sequential manner and piped to a logic evaluation unit (LEU). During the operation, a program counter advances continuously through the instruction memory one row per cycle. Sometimes, the LEUs do not need instructions during some cycles. In these cases, the program counter nevertheless advances during these cycles, and the IM contains no instructions in the rows corresponding to these cycles. This results in wasted space in the IM.

The LEU, based on received instructions, simulates the represented segment of the netlist. In hardware simulation accelerators, each LEU has a dedicated IM that supplies the instruction stream to that and only that LEU. Moreover, the IM is read at a constant speed and in a certain sequence. Also, the capacity of hardware simulation accelerators is determined largely by the size of the IM. Clearly, a need exists to reduce or optimize the amount of data stored in the IM.

Accordingly, there exists a need in the art to overcome the deficiencies and limitations described hereinabove.

SUMMARY OF THE INVENTION

In a first aspect of the invention, a hardware simulation accelerator comprises clusters of multiple LEUs that are connected to multiple IMs configurable to provide a stream of instructions to one or more LEU of the multiple LEUs from any of the multiple IMs, thereby allowing any number of the LEUs to receive a unique instruction stream or to share a same instruction stream with one or more of the multiple LEUs.

In another aspect of the invention, a method comprises streaming same instructions from a single instruction memory (IM) to N number of LEUs to process a parallel part of a netlist.

In another aspect of the invention, a computer program product comprising a computer usable medium having readable program code embodied in the medium is provided. The computer program product includes at least one component to perform the functions of the invention as described herein. For example, the computer program product includes at least one component to decouple multiple LEUs from a single IM thereby allowing a group of LEUs to share a common pool of IMs.

DETAILED DESCRIPTION OF EMBODIMENTS OF THE INVENTION

The invention generally relates to a system and method for design verification and, more particularly, the invention relates to a hardware simulation accelerator design and method that exploits a parallel structure of user models to support a larger user model size. In operation, the hardware simulation system comprises two or more LEUs and instruction memory (IM). The LEUs obtain their instructions in parallel from the same instruction stream, so each instruction in the stream is multiplexed to the two or more LEUs. Thus, the present invention reduces the number of IMs used during the execution of a parallel segment of the nestlist. In embodiments, the system and method of the invention is not limited to any particular kind of distributed network.

In more specific implementations, the system and method of the invention decouples the LEU from its IM, allowing a group of LEUs to share a common pool of IMs. That is, any single IM does not have to be dedicated to any of the multiple LEUs. Rather than having N sets of instructions that describe N instances of the same logic, one set of instruction is sent from one IM to N LEUs. This reduces the number of needed instructions, which increases the instructions available to describe additional logic, thus increasing the overall capacity. The system and method of the invention thus utilizes the repetition found in the design under test. In this manner, the LEUs are no longer dedicated to specific IM and it is thus possible to reduce the amount of data stored in the IM.

Even more specifically, the invention utilizes several parallel instances of the same user logic which is found in most user models, e.g., four identical cores within a chip; compared to current accelerators which cannot make use of this parallel structure since each of the parallel instances is stored separately in pre-processed form in the IM associated with one or more LEUs or chips. By using the system and method of the invention, it is now possible for the instruction memories to produce a longer stream of instructions.

System Environment

Figure 1:
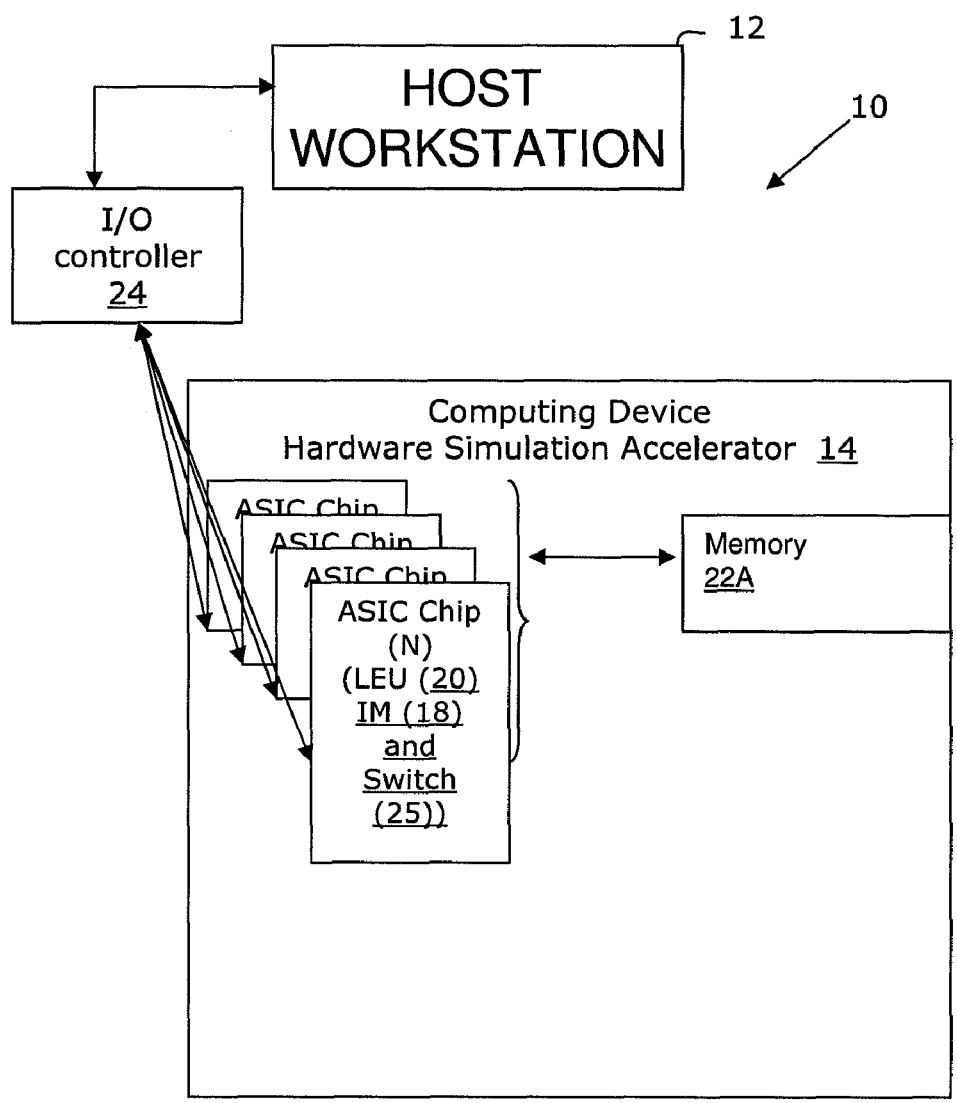
FIG. 1 shows an illustrative environment for implementing the invention.

FIG. 1 shows an illustrative environment 10 for managing the processes in accordance with the invention. The illustrative environment may represent a hardware simulation accelerator 14 that exploits a parallel structure of user models to support a larger user model size. The invention increases the model size that can be simulated given the limited amount of IM on a given chip. The switching network connecting LEUs and IMs would be implemented on a single chip. The hardware simulation accelerator may be connected to a host work station 12, which has storage, I/O and a number of programs, etc. In more particular embodiments, the host work station 12 can be connected to the I/O controller 24, as it is the interface between the host and the ASIC chips.

The hardware simulation accelerator 14 includes a number of ASIC chips, each having a number of clusters of processors (LEUs) 20 and IMs 18. The LEUs 20 may be representative of any number N of LEUs 20 which are configured to communicate with one another over any type of communication link such as a bus. The communication between clusters of LEUs is designed to enable parallel processing of instruction sets in accordance with the invention. For instance, if the clusters contain N number of LEUs and N number of IMs, the communication between clusters C1 and C2 will allow sending and receiving of N values in parallel. Furthermore, if a particular instruction causes LEU 0 in Cluster C1 to access a value from LEU 0 in cluster C2, then the same instruction will cause any LEU in cluster C1 to access the corresponding value from a corresponding LEU in cluster C2. (See, e.g., FIG. 2.) As should be recognized by those of skill in the art, the computing device 14 includes a number of clusters of LEUs and IMs per ASIC chip, and that there may be more than one ASIC chip.

The N number of LEUs 20 are connected to N number of instruction memories (IMs) 18 via a switching network (See, also FIG. 3) that can be dynamically programmed in every instruction. The IMs may be either directly connected or clustered with an equal number of LEUs 20. In this manner, the switching network is configured to switch instruction streams from the single IM to any of the multiple LEUs. The switching network 25 may include a hardware switch implemented, for example, using multiplexers. A single memory per ASIC chip configures all switching networks of the multiple LEUs and IMs on the ASIC chip identically. By using the switching it is possible to cluster or group any number of LEUs with any number or specific IMs.

In embodiments, the switch 25 is configured such that each LEU 20 can receive an instruction set (instruction stream) from a single IM 18 at each time step. In this implementation, each LEU 20 is capable of receiving a unique instruction from a single IM 18 (or multiple IMs). Alternatively, the switch 25 is configured such that N number of LEUs 20 can receive the same instruction stream from one IM 18 at each time step. Thus, the present invention is configured to take advantage of partitioning of a netlist by having multiple LEUs receive the same instruction set from a single IM (while each still being configured to receive unique instructions from a single IM, when applicable). This can be realized by noting that the netlist has an inherent number of parallel instances of the same logic that can be partitioned or segmented into parallel instruction sets for processing. Accordingly, different LEUs 20 can be clustered to different IMs 18, thus reducing overall storage requirements in the IM 18. As such, larger netlists (more nets) can be stored and hence processed by the implementation of the system and method of the invention.

In further implementations, the inputs of the parallel instruction sets are aligned in the registers or memories of different LEUs. This alignment allows for the different LEUs to obtain the input values for each instruction set at the same location. The inputs are aligned so that N LEUs processing the same instruction can get the input values from the same relative location.

Still referring to FIG. 1, memory 22A may be used to program the switching network 25. LEU 20 executes the computer program code and logic of the system and method of the invention, which is stored in memory 22A and IM 18. The IM will provide instructions to the LEU 20. An I/O controller 24 is connected to each of the ASIC chips.

Figure 2:
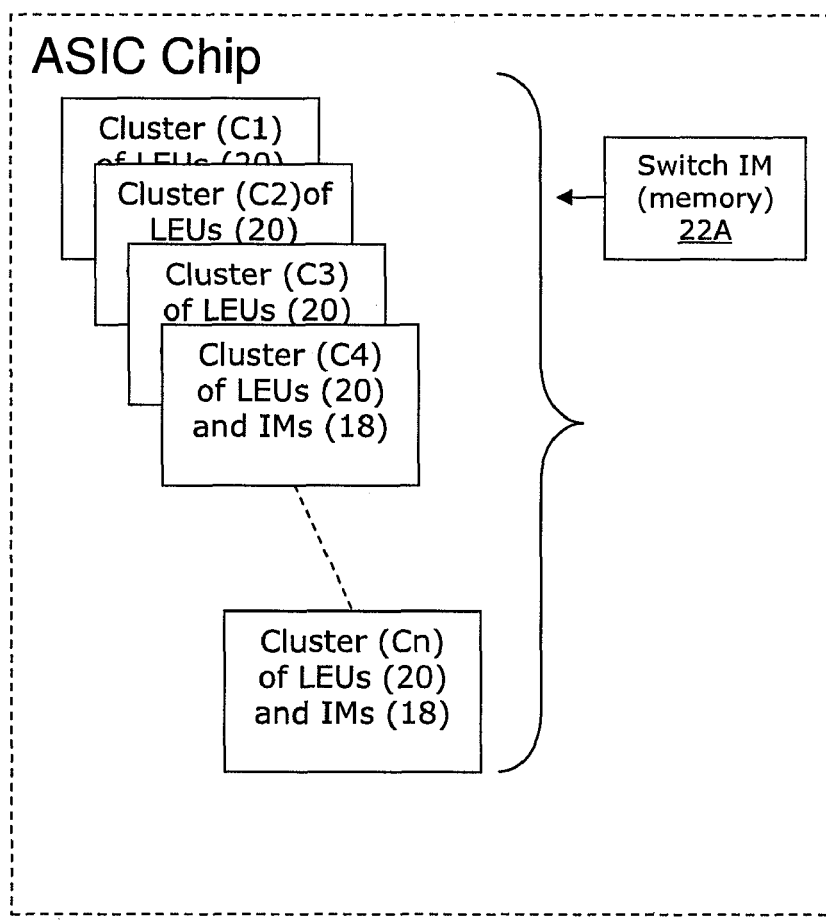
FIG. 2 shows an ASIC chip with N number of clusters of LEUs and IMs in accordance with an embodiment of the invention.

FIG. 2 shows an ASIC chip with a number of clusters of LEUs 20 and IMs 18, each of which are connected to the memory 22A (switch memory for the IM). In embodiments, a same number of LEUs 20 and IMs are provided in each of the clusters.

Exemplary Schematic of the System of the Invention

Figure 3:
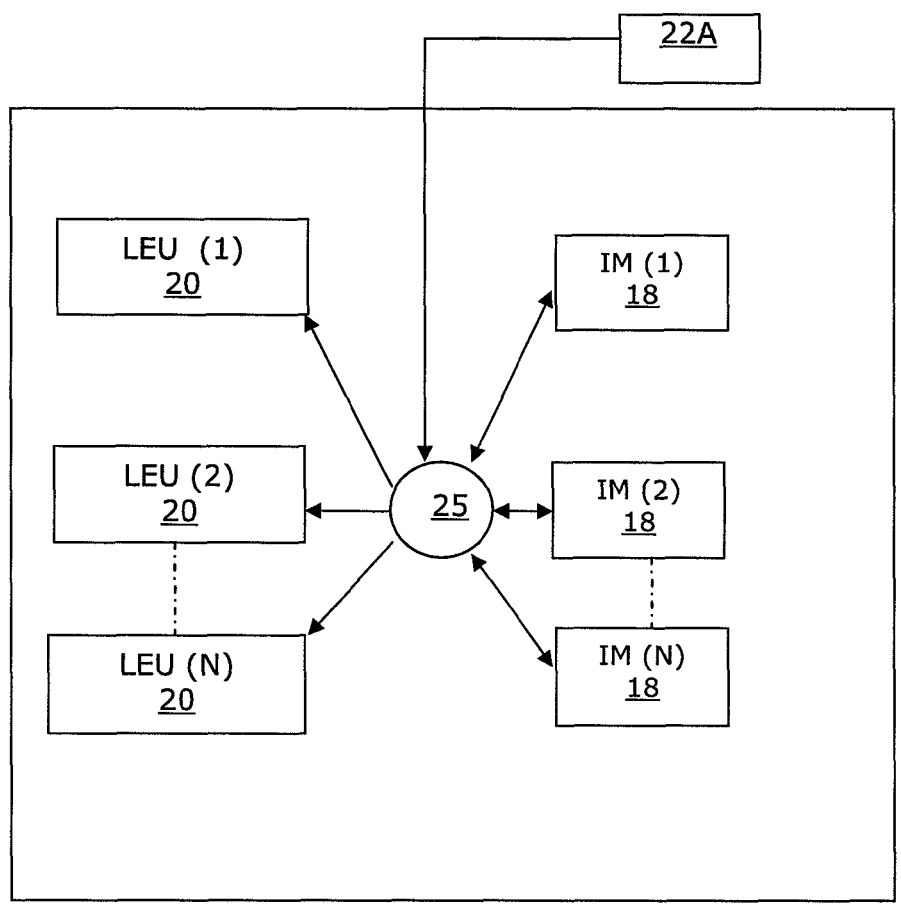
FIG. 3 shows a schematic circuit diagram in accordance with the invention.

FIG. 3 shows an exemplary mapping of logic between N number of LEUs and IMs. In particular, FIG. 3 shows N instruction memories (IMs) connected to N logic evaluation units (LEUs) via a switching network 25 that is dynamically programmed for every instruction. The memory (Switch IM) 22A is used to program the switching network. Note that the arrows from the switching network 25 to each of the LEUs and IMs are bidirectional thus indicating that the switching network is capable of telling the IMs whether to increment their address counter.

Execution of the same instruction on multiple LEUs in parallel has implications for the implementation of sticks and breakpoints on parallel nets, and parallel array ports. Sticks and breakpoints are normally implemented by changing the instruction memory, but that would affect all parallel instances. Instead, in the present invention, stick and breakpoint functionality is configured in a separate, non-parallel array, or using the data memory, or by virtual logic. Another possibility contemplated by the invention is to unparallelize a particular instruction when sticks or breakpoints are applied. User arrays could be parallelized if several parallel arrays exist in the hardware. If only one memory exists for user arrays, accesses could be sequentialized by the hardware, or instructions that set array ports could be moved outside of parallel blocks of logic.

Occasionally, for example in order to align the inputs to parallel logic, or when the user logic is not parallel, all LEUs need unique instructions. Therefore, the switching network must support sending unique instructions to each LEU.

Additional Features of the System and Method

In a more specific illustrative and non-limiting example, N number of IMs and N number of LEUs may be clustered together. Each LEU may use any of the IMs in the group allowing the same instruction stream to drive multiple LEUs. An additional improvement over the traditional design is that the reading of the IM may be suspended if no LEU is receiving the instruction stream from a particular IM. In other words, reading of any single IM is suspended whenever none of the multiple LEUs are configured to receive an instruction from the any single IM.

Moreover, by compiling large blocks of parallel logic only once, in accordance with the invention, it is possible to reduce the amount of IM required to implement the blocks of parallel logic. In this way, during simulation, these compiled blocks of parallel logic will be read out from a single IM and multiple LEUs simulating the parallel blocks concurrently will receive the instruction stream. This technique reduces the size of the compiled representation of the design under test thus allowing bigger designs to be simulated on the hardware simulation accelerator.

In theory, an instruction stream of up to N times the depth of each instruction memory can be supplied by the present invention using N shared IMs. However, due to limitations in parallelism and overhead associated with aligning the gate evaluations for the parallel blocks of logic, an N times longer instruction stream is not practically achievable. Depending on the degree of parallelism, an increase in depth/capacity of N/2 times is feasible. It is also contemplated by the present invention that instruction streams of any number less than N times the depth of each instruction memory can be achieved by the present invention, depending on the size of the netlist.

Thus, in embodiments, due to the overhead associated with aligning inputs to blocks of parallel logic, it is most efficient to use this parallel evaluation if the parallel blocks of logic have only few external inputs compared to the size of the block of logic. Generally, the larger the block of parallel logic, the better the ratio of internal nets to inputs. Therefore, the architecture of a hardware simulation accelerator implementing the invention should be optimized to process very large blocks of parallel logic. In particular, evaluating large blocks of parallel logic means that all clusters of N LEUs and IMs on a chip will be able to evaluate a large block of parallel logic together. Thus, all such clusters on a chip will be parallelized in the same way, such that the memory that is used to program the switching network between IMs and LEUs can be shared between all clusters on a chip. Programming the switching network of all clusters of LEUs on a chip in the same way saves a lot of memory, but is not a requirement for this invention.

It is noted, though, that there is an overhead associated with using parallel instructions. Specifically, because the parallel instances of the design are simulated concurrently, their input vectors have to be available before the concurrent simulation may start. Also, the input vectors have to be aligned so that identical instructions executed on different LEUs will access the respective corresponding inputs of the block of parallel logic that each LEU evaluates.

Another implication is that the communication between clusters of LEUs is designed to be parallelizable. For instance, if a particular instruction executed on LEU 0 in cluster 0 reads a value from LEU 0 in cluster 1, then if that instruction were executed on LEU 1 in cluster 0, it should read the corresponding value from LEU 1 in cluster 1. The communication between chips is also designed and configured in the same way, so that parallel evaluation of blocks of logic is not limited by chip-to-chip communication.

The invention can take the form of an entirely hardware embodiment or an embodiment containing both hardware and software elements. The hardware and software elements include a computer infrastructure configured to implement the functionality of the present invention. The computer infrastructure may take the form, for example, of the environment of FIG. 1. The software elements may be firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

In embodiments, a service provider, such as a Solution Integrator, could offer to perform the processes described herein. In this case, the service provider can create, maintain, deploy, and support, etc., a computer infrastructure that performs the process steps of the invention for one or more customers. In return, the service provider can receive payment from the customer(s) under a subscription and/or fee agreement.

While the invention has been described in terms of embodiments, those skilled in the art will recognize that the invention can be practiced with modifications and in the spirit and scope of the appended claims.

What is claimed is:

1. A hardware simulation accelerator comprising clusters of multiple LEUs (logic evaluation unit) that are connected to multiple IMs (instruction memory) configurable to provide a stream of instructions to one or more LEU of the multiple LEUs from any of the multiple IMs, thereby allowing any number of the LEUs to receive a unique instruction stream or to share a same instruction stream with one or more of the multiple LEUs, wherein at least one IM is configured to stream same instructions to N number of LEUs to process a parallel part of a netlist.

2. The hardware simulation accelerator of claim 1, wherein reading of any single IM is suspended whenever none of the multiple LEUs are configured to receive an instruction from the any single IM.

3. The hardware simulation accelerator of claim 1, wherein one or more of the multiple IMs are operable to provide a single instruction stream to one or more LEUs of the multiple LEUs.

4. The hardware simulation accelerator of claim 1, further comprising at least one switch operable to switch instruction streams from any number of the IMs to any of the multiple LEUs.

5. The hardware simulation accelerator of claim 1, wherein any single IM is not dedicated to any of the multiple LEUs.

6. The hardware simulation accelerator of claim 1, wherein the multiple LEUs are operable to implement stick and breakpoint functionality in at least one of a separate, non-parallel array, using data memory, by virtual logic and unparallelizing a particular instruction.

7. The hardware simulation accelerator of claim 1, further comprising a communication link operable to provide communication between each cluster of the multiple LEUs, enabling parallel processing of instructions.

8. The hardware simulation accelerator of claim 1, further comprising a switching network between the multiple LEUs and IMs which can be dynamically configured in every instruction.

9. The hardware accelerator of claim 1, wherein a single memory per ASIC chip configures all switching networks of the multiple LEUs and IMs on the ASIC chip identically.

10. A method comprising connecting multiple IMs (instruction memories) to a cluster of multiple LEUs (logic evaluation units) and streaming instructions to one or more LEUs of the multiple LEUs from any one of the multiple LEUs, and streaming same instructions from at least one IM to N number of LEUs to process a parallel part of a netlist.

11. The method of claim 10, further comprising processing non parallel parts of the netlist by the N number of LEUs.

12. The method of claim 10, further comprising switching instruction streams from a single IM to any of the N number of LEUs.

13. The method of claim 10, further comprising communicating between clusters of LEUs to allow sending and receiving of N values in parallel.

14. The method of claim 13, wherein when a particular instruction causes a first LEU in a first cluster to access a value from another LEU in a second cluster, then a same instruction will cause another LEU in the first cluster to access a corresponding value from a corresponding LEU in the second cluster.

15. The method of claim 10, further comprising communicating between each of the N number of LEUs, enabling parallel processing of instructions.

16. The method of claim 10, further comprising dynamically programming a switching network for every instruction.

17. The method of claim 10, further comprising implementing stick and breakpoint functionality in at least one of: using a separate, non-parallel array to store stick and breakpoint instructions, using data memory which is unique to each LEU, by virtual logic, and by unparallelizing a particular instruction.

18. The method of claim 10, further comprising suspending reading of instruction memory whenever none of the N number of LEUs are configured to receive an instruction from the single IM such that an address counter of the single IM does not increment.

19. A computer program product comprising a computer usable medium having readable program code embodied in the medium, the computer program product includes at least one component to decouple multiple LEUs (logic evaluation units) from a single IM (instruction memory) thereby allowing a group of LEUs to share a common pool of IMs, wherein at least one IM is configured to stream same instructions to N number of LEUs to process a parallel part of a netlist.

* * * * *